(12) United States Patent
Haeno et al.

(10) Patent No.: US 6,526,089 B1
(45) Date of Patent: Feb. 25, 2003

(54) LASER MARKER AND METHOD OF LIGHT SPOT ADJUSTMENT THEREFOR

(75) Inventors: Makoto Haeno, Tokyo (JP); Yasumasa Iketani, Tokyo (JP)

(73) Assignee: Sunx Limited, Tokyo (JP)

( * ) Notice: Subject to any disclaimer, the term of this patent is extended or adjusted under 35 U.S.C. 154(b) by 0 days.

(21) Appl. No.: 09/505,693

(22) Filed: Feb. 18, 2000

(30) Foreign Application Priority Data

Sep. 29, 1999 (JP) ............................................ 11-275760

(51) Int. Cl.⁷ .................................................. H01S 3/08
(52) U.S. Cl. .......................... 372/101; 372/98; 372/75; 33/286; 33/21; 219/121.6; 219/121.73; 219/121.67; 219/121.58
(58) Field of Search ............................ 372/101, 75, 98; 33/286, 21; 219/121.6, 121.73, 121.67, 121.58; 359/869, 850, 852, 859, 853, 867, 710, 641, 719, 823, 637, 716, 645, 784

(56) References Cited

U.S. PATENT DOCUMENTS

| | | | |
|---|---|---|---|
| 4,044,222 A | | 8/1977 | Kestenbaum |
| 4,114,018 A | | 9/1978 | Allmen et al. |
| 4,318,594 A | * | 3/1982 | Hanada ........................ 359/710 |
| 4,399,345 A | | 8/1983 | Lapham et al. |
| 4,483,005 A | | 11/1984 | Smart |
| 5,059,764 A | | 10/1991 | Baer |
| 5,208,437 A | | 5/1993 | Miyauchi et al. |
| 5,265,114 A | | 11/1993 | Sun et al. |
| 5,400,350 A | | 3/1995 | Galvanaukas |
| 5,473,624 A | | 12/1995 | Sun |
| 5,569,398 A | | 10/1996 | Sun et al. |
| 5,656,186 A | | 8/1997 | Mourou et al. |
| 5,694,408 A | | 12/1997 | Bott et al. |
| 5,859,868 A | * | 1/1999 | Kyusho et al. ................ 372/71 |
| 5,920,668 A | | 7/1999 | Uehara et al. |
| 5,936,218 A | * | 8/1999 | Ohkawa et al. ..................... 1/1 |
| 5,998,759 A | | 12/1999 | Smart |
| 6,104,523 A | * | 8/2000 | Ang .......................... 347/233 |
| 6,189,795 B1 | * | 2/2001 | Ohkawa et al. ........ 235/462.39 |

FOREIGN PATENT DOCUMENTS

| | | |
|---|---|---|
| JP | B2-63-49204 | 10/1988 |
| WO | WO98/42050 | 9/1998 |
| WO | WO98/53949 | 12/1998 |

OTHER PUBLICATIONS

Xenon Laser Repairs Liquid Crystal Displays, Lasers and Optronics, pp. 39–41, Apr. 1988.
L.M. Scarfone, et al., Computer Simulation of Target Link Explosion in Laser Programmable Redundancy for Silicon Memory, 1986, p. 371.
Litwin and Smart, Laser Adjustment of Linear Monolithic Circuits, 100/Laser Institute of America, vol. 38, ICAELO, 1983.

(List continued on next page.)

*Primary Examiner*—Paul Ip
*Assistant Examiner*—Delma R. Flores Ruiz
(74) *Attorney, Agent, or Firm*—Oliff & Berridge, PLC

(57) ABSTRACT

A laser marker includes a collimator lens converting laser light emitted from a broad area semiconductor laser into substantially parallel beams of light, a cylindrical concave lens permitting to pass therethrough the laser light having passed through the collimator lens and being perpendicular to a plane of an active layer of the semiconductor laser, the cylindrical concave lens serving as a concave lens for the laser light having passed through the collimator lens and being parallel to the plane of the active layer, a cylindrical convex lens permitting to pass therethrough the laser light having passed through the concave lens and being perpendicular to the plane of the active layer of the semiconductor laser, the cylindrical convex lens serving as a convex lens for the laser light having passed through the collimator lens and being parallel to the plane of the active layer, and a focusing lens focusing the laser light having passed through the cylindrical convex lens.

10 Claims, 6 Drawing Sheets

OTHER PUBLICATIONS

Masao Mitani, et al., Laser Cutting of Aluminum Thin Film with No Damage to Under–Layers, Annals of the Cirp. vol. 28/1, 1979.

Xinbing Liu, et al., Ultrashort Laser Pulses Tackle Precision Machining, Laser Focus World, Aug. 1997, pp. 101–118.

Philippe Bado, Ultrafast Lasers Escape the Lab, Photonics Spectra, Jul. 1998, pp. 157–161.

John F. Ready, Effects of High Power Laser Radiation, Academic Press, New York, 1971, pp. 115–116.

Sidney S. Charschan, Guide for Material Processing By Lasers, Laser Institute of America, The Paul M. Harrod Company, Baltimore, MD, 1977, pp. 5–1 to 5–13.

Joseph B. Bernstein, et al., Analysis of Laser Metal–Cut Energy Process Window (to be published).

R.S. Patel, et al., Via Production Benefits From Excimer–Laser Tools, Laser Focus World, Jan. 1996, pp. 71–75.

Mark Gitin, UV Lasers: State of the Art Is All–Solid–State, Photonics Spectra 1998, pp. 136–139.

Murray Hill, Fiber Laser Sets A Record, Photonics Spectra, New Jersey, Aug. 1997, p. 32.

Raevsky, Eugene V., et al., Stabilizing the Output of a Pockels Cell Q–Switched ND:YAG Laser, Society of Photo–Optical Instrumentation Engineers, 38 (11) 1781–1784, Nov. 1999.

Bernstein, Joseph B., et al., Laser Energy Limitation for Buried Metal Cuts, http://www.enre.umd.edu/JB/paper-1.html, Mar. 17, 2000.

Anderson, Stephen G., Solid–State UV Lasers Drill Vias Effectiveley, Laser Focus World, Feb. 1996.

* cited by examiner

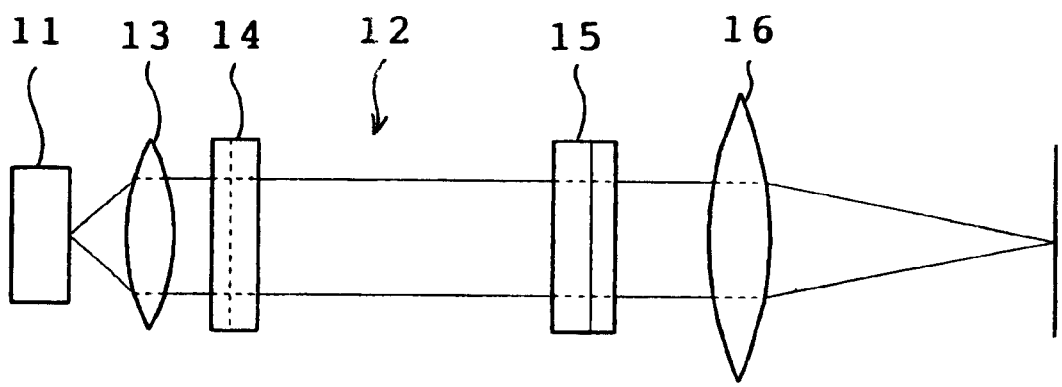
F I G. 1
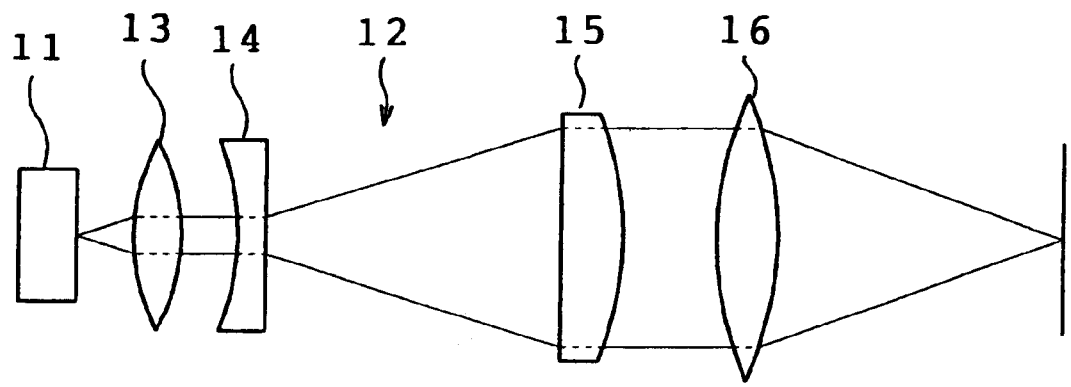
F I G. 2

LASER MARKER AND METHOD OF LIGHT SPOT ADJUSTMENT THEREFOR

BACKGROUND OF THE INVENTION

1. Field of the Invention

This invention relates to a laser marker employing a broad area semiconductor laser emitting multimode laser light which is focused by an optical system, thereby marking an object made of a metal or resin, for example, and a method of light spot adjustment for the laser marker.

2. Description of the Prior Art

A broad area semiconductor laser is conventionally used as an oscillator for laser markers. This type of semiconductor laser has an active region having a large area so that a high output is obtained. However, a stripe of the active region has a larger width than normal semiconductor lasers. Accordingly, laser light emitted from the broad area semiconductor laser has the shape of an ellipse which is long perpendicularly to a plane of an active layer. An ideal circular small light spot cannot be obtained even when the aforesaid laser light is focused by a usual optical system. As a result, an obtained energy density is not sufficient to mark an object. To overcome this drawback, the prior art has used a special optical system for reshaping the small light spot into a substantially circular shape.

FIGS. 11 and 12 show one of the aforesaid special optical systems. As shown, laser light emitted from a semiconductor laser 1 is converted by a collimator lens 2 to parallel beams of light. The light beams are further caused to pass through an anamorphic prism 5 so that a width of the light parallel to the plane of the active layer is increased so as to become approximately equal to a width of the light perpendicular to the plane of the active layer. By application of the above-described optical system, a generally circular laser light is caused to impinge onto the focusing lens and focused so that a circular small light spot is obtained.

However, the above-described constitution has the following problems. First, the width of the parallel light needs to be increased with increase in a stripe width of the active region of the semiconductor laser 1. This increases geometrical dimensions of the anamorphic prism 3 and accordingly increases the size of the optical system, resulting in increases in the weight and cost of the system.

Secondly, the broad area type semiconductor laser 1 has a large astigmatism. More specifically, the aforesaid perpendicular laser light and the parallel laser light have apparent outgoing positions (the centers of divergent pencil of rays) shifted from each other in the direction of an optical axis to a large extent. Accordingly, when the location of the collimator lens is adjusted so that the perpendicular laser light becomes parallel light beams, the parallel laser light having passed through the collimator lens 2 does not become parallel light beams by an adverse effect of the astigmatism. Thus, the lens 4 focuses the perpendicular laser light but does not focus the parallel laser light, whereupon a small light spot cannot be obtained. In order that this problem may be solved, a cylindrical lens 5 with a long focal distance is provided in the rear of the collimator lens 2 to correct the astigmatism so that the parallel laser light becomes parallel light beams.

However, since the astigmatism varies from one semiconductor laser to another, the cylindrical lenses 5 need to have different focal distances according to the variations in the astigmatism. This requires various types of cylindrical lens, resulting in an increase in the manufacturing cost.

Thirdly, the focal distance of the focusing lens 4 generally has an error ranging between 2 and 3%. Accordingly, the location of the focusing lens 4 needs to be adjusted according to the error of the focal distance. This adjustment is troublesome.

SUMMARY OF THE INVENTION

Therefore, an object of the present invention is to provide a laser marker in which the laser light emitted from the broad area type semiconductor laser can be focused into a small light spot by the optical system without an increase in the size thereof.

The present invention provides a laser marker comprising a collimator lens converting laser light emitted from a broad area semiconductor laser into substantially parallel beams of light, a cylindrical concave lens permitting to pass therethrough the laser light having passed through the collimator lens and being perpendicular to a plane of an active layer of the semiconductor laser, the cylindrical concave lens serving as a concave lens for the laser light having passed through the collimator lens and being parallel to the plane of the active layer, a cylindrical convex lens permitting to pass therethrough the laser light having passed through the concave lens and being perpendicular to the plane of the active layer of the semiconductor laser, the cylindrical convex lens serving as a convex lens for the laser light having passed through the collimator lens and being parallel to the plane of the active layer, and a focusing lens focusing the laser light having passed through the cylindrical convex lens.

According to the above-described construction, the laser light emitted from the semiconductor laser is converted into the substantially parallel light beams when passing through the collimator lens. The parallel light beams impinge through the cylindrical concave and convex lenses onto the focusing lens. The focusing lens focuses the incident perpendicular laser light and parallel laser light.

The location of the collimator lens is adjusted so that an incident angle of the perpendicular laser beam incident onto the focusing lens can be adjusted. Further, the locations of the cylindrical concave and convex lenses are adjusted so that an incident angle of the parallel laser beam incident onto the focusing lens can be adjusted. Accordingly, the laser light can be focused by the focusing lens into the small light spot. In this case, by the adjustment of the optical system, the incident angles of the perpendicular laser light and the parallel laser light both incident onto the focusing lens are adjusted so that a focusing location of the small light spot is adjusted.

Even when the apparent outgoing locations of the perpendicular laser light and the parallel laser light are shifted from each other by the influence of astigmatism, the influence can be prevented since the locations where the perpendicular laser light and the parallel laser light are focused respectively can be adjusted independent of each other. Further, the incidence angles of the perpendicular laser light and the parallel laser light both incident on the focusing lens can be adjusted. Consequently, the influences of the differences in the focal distances of the focusing lenses can be canceled and the laser light can be focused at a target location by the focusing lens.

In a preferred form, the collimator lens and the cylindrical concave lens are movable together. Consequently, optical axes of the respective lenses can be caused to accurately agree with each other. Further, the incidence angle of the perpendicular laser light incident on the focusing lens can be adjusted. In this case, the incidence angle of the parallel laser light incident on the focusing lens is varied as the result of simultaneous movement of the cylindrical concave lens. However, the location of the cylindrical convex lens can be adjusted so that the incidence angles of the respective laser beams perpendicular and parallel to the active layer of the semiconductor laser are equal to each other when the perpendicular laser light and the parallel laser light are equidistant from an optical axis. Additionally, the incidence angle of the perpendicular laser light incident on the focusing lens is not varied even when the location of the cylindrical convex lens is adjusted as described above. Consequently, the laser light can be focused by the focusing lens into a small light spot.

In another preferred form, the focusing lens is fixed. The incidence angles of the perpendicular laser light and the parallel laser light incident on the focusing lens can be adjusted so that the location where the laser light is focused by the focusing lens can be adjusted.

BRIEF DESCRIPTION OF THE DRAWINGS

Other objects, features and advantages of the present invention will become clear upon reviewing of the following description of the preferred embodiment, made with reference to the accompanying drawings, in which:

FIG. 1 is a side view of the optical system employed in a laser marker of a preferred embodiment in accordance with the present invention;

FIG. 2 is a schematic plan view of the optical system;

DETAILED DESCRIPTION OF THE PREFERRED EMBODIMENT

Figure 3:
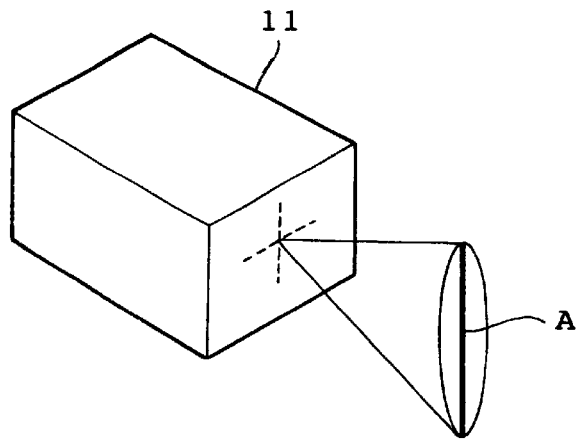
FIG. 3 is a schematic perspective view of the semiconductor laser, typically showing a perpendicular laser light.

One embodiment of the present invention will be described with reference to FIGS. 1 to 10. Referring to FIGS. 1 and 2, an optical system employed in the laser marker of the embodiment is shown. An optical system 12 is provided on an optical axis of a semiconductor laser 11. The optical system 12 includes a collimator lens 13, a cylindrical concave lens 14, a cylindrical convex lens 15, and a focusing lens 16 disposed in this order on the optical axis of the semiconductor laser 11.

Figure 4:
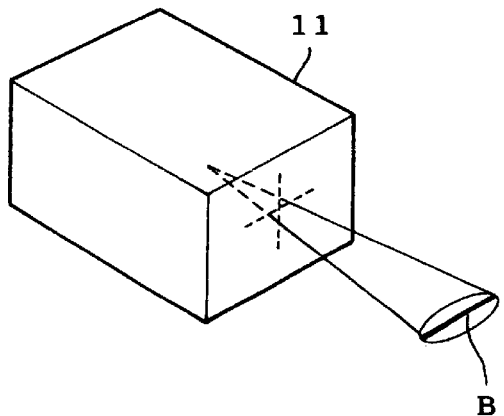
FIG. 4 is a schematic perspective view of the semiconductor laser, typically showing a parallel laser light.
Figure 5:
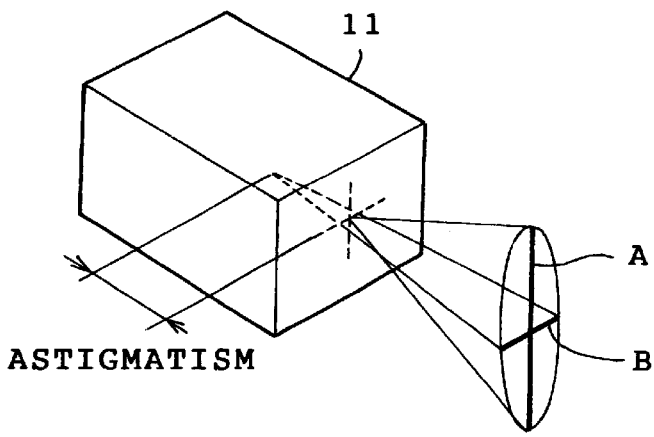
FIG. 5 is a schematic perspective view of the semiconductor laser, typically showing outgoing laser light.

The semiconductor laser 11 is a broad area laser diode having a large area of active region for accomplishment of a high power. For this purpose, the semiconductor laser 11 has a larger stripe width than normal semiconductor lasers. As a result, laser light A or a first light component emitted in a direction perpendicular to an active layer of the semiconductor laser 11 has a large spread as shown in FIG. 3. On the other hand, laser light B or a second light component emitted in a direction parallel to the active layer has a smaller spread than the perpendicular laser light A as shown in FIG. 4. The overall laser light has the shape of an ellipse which is long perpendicularly to the active layer as shown in FIG. 5. Further, as the result of influence of an astigmatism, the perpendicular. laser light and the parallel laser light have apparent positions shifted from each other in the direction of an optical axis.

The collimator lens 13 is positioned so as to convert the laser light emitted from the laser 11 to substantially parallel light beams. The cylindrical concave lens 14 serves as a concave lens for the parallel laser light but does not serve as a concave lens for the perpendicular laser light. In other words, the cylindrical concave lens 14 is positioned so that it permits the perpendicular laser light to pass therethrough as shown in FIG. 1 and spreads the parallel laser light horizontally as shown in FIG. 2.

The cylindrical convex lens 15 serves as a convex lens only for the parallel laser light but does not serve as a convex lens for the perpendicular laser light. In other words, the cylindrical convex lens 15 is positioned so that it permits the perpendicular laser light to pass therethrough as shown in FIG. 1 and converts the parallel laser light spread by the concave lens 14 to substantially parallel light beams as shown in FIG. 2. The collimator lens 13, and the cylindrical convex and concave lenses are further positioned so that incidence angles of the perpendicular laser light and the parallel laser light both incident on the focusing lens 16 are equal to each other when the perpendicular laser light and the parallel laser light are equidistant from the optical axis.

The focusing lens 16 focuses the substantially parallel laser light incident thereon. In this case, the incidence angles of the perpendicular laser light and the parallel laser light both incident on the focusing lens 16 are set to be equal to each other when the perpendicular laser light and the parallel laser light are equidistant from the optical axis. Accordingly, the perpendicular laser light and the parallel laser light can be focused at a single spot by the focusing lens 16 such that a small light spot is provided. Further, the beam width of the parallel laser light incident on the focusing lens 16 is increased so that the elliptic section of the overall incident laser light is corrected to a substantially circular form. Consequently, the energy density for the small light spot can sufficiently be improved.

The optical system 12 is adjusted so that the incident angles of the perpendicular laser light and the parallel laser light both incident on the focusing lens 16 are adjusted, whereby the location where the laser light is focused can be adjusted.

The operation of the perpendicular laser light will now be described in the case where it passes through the optical system. The perpendicular laser light is converted to the substantially parallel beams by the collimator lens 13. The perpendicular laser light passes through the cylindrical concave and convex lenses 14 and 15 in the state of the parallel beams. In this case, the cylindrical concave and convex lenses 14 and 15 do not serve as the concave and convex lenses respectively for the perpendicular laser light. Accordingly, the perpendicular laser light passes through the cylindrical concave and convex lenses 14 and 15 to be incident on the focusing lens 16 to be focused. The location where the perpendicular laser light is focused depends upon an incidence angle of the perpendicular laser light incident on the focusing lens 16. The perpendicular laser light focuses on a focal point of the focusing lens 16 when being incident as the parallel light beams. Thus, the locations of the collimator lens 13 and the focusing lens 16 are adjusted such that the perpendicular laser light can be focused on a target location.

The following is the description of the operation in the case where the parallel laser light passes through the optical system 12. The parallel laser light is converted to the substantially parallel light beams by the collimator lens 13. The parallel laser light passes through the cylindrical concave and convex lenses 14 and 15 in the state of the parallel light beams. In this case, the cylindrical concave lens 14 serves as the concave lens for the parallel laser light. Accordingly, the cylindrical concave lens 14 spreads the parallel laser light horizontally into the shape of a fan. The parallel laser light is incident on the cylindrical convex lens 15 in the spread state. The lens 15 serves as the convex lens for the parallel laser light. Accordingly, the parallel laser light is focused by the convex lens 15 to be converted to the substantially parallel light beams. The parallel laser light is incident on the focusing lens 16 in the converted state to be focused. The location where the parallel laser light is focused depends upon the incidence angle of the parallel laser light incident on the focusing lens 16. The parallel laser light focuses on the focal point of the focusing lens 16 when the parallel laser light is parallel incident on the focusing lens 16. Accordingly, the locations of the cylindrical concave and convex lenses 14 and 15 are adjusted so that the parallel laser light can be focused on a target location.

The locations of the collimator lens 13 and the concave and convex lenses 14 and 15 are adjusted so that the incidence angles of the perpendicular and parallel laser lights both incident on the focusing lens 16 are adjusted to be equal to each other when the perpendicular laser light and the parallel laser light are equidistant from the optical axis. As a result, the location where the perpendicular laser light and the parallel laser light are focused by the focusing lens 16 agrees with the target location. Accordingly, the laser light can be focused by the focusing lens 16 into a small light spot.

The apparent outgoing location of the parallel laser light is shifted in the direction of the optical axis of the semiconductor laser 11 relative to the apparent outgoing location of the perpendicular laser light by the influence of the astigmatism. However, as described above, the incidence angle of the parallel laser light incident on the focusing lens 16 can be adjusted independent of the incidence angle of the perpendicular laser light. Consequently, the influence of the astigmatism can be canceled.

Since the parallel laser light is the multimode light, it cannot efficiently be focused to a single point by an optical system focusing a single mode laser light. However, Japanese Examined Patent Application Publication No. 63-49204 (1988) discloses a method of efficiently focusing the multimode laser light emitted from a semiconductor laser. In the disclosed method, it is effective that the light incident on the focusing lens has the shape of an ellipse long horizontally. In the embodiment, the locations of the cylindrical concave and convex lenses 14 and 15 are adjusted so that the width of the parallel laser light incident on the focusing lens 16 is larger than that of the perpendicular laser light. As the result of the above-described adjustment applied to the optical system 12, the laser light can be focused by the focusing lens 16 into a small lightspot. Since the small light spot has a large energy density, the object can reliably be marked.

Figure 6:
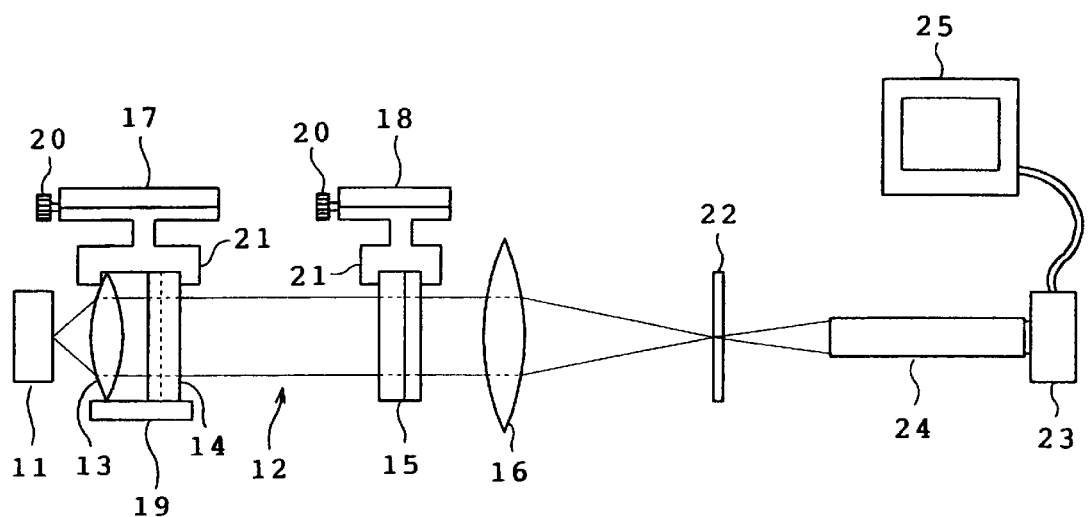
FIG. 6 is a side view of the optical system, showing a manner of adjusting a location where the laser light is focused.
Figure 7:
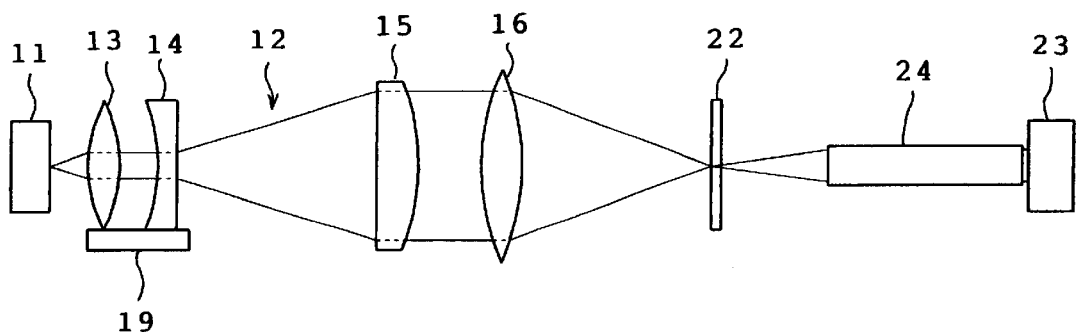
FIG. 7 is a plan view of the optical system.

A more concrete adjustment for the optical system 12 will now be described with reference to FIGS. 6 and 7. The optical system 12 is adjusted by a location adjusting jig during assembly of the products. The location adjusting jig includes a first adjusting jig 17 and a second adjusting jig 18.

In an actual product, the collimator lens 13 and the cylindrical concave lens 14 are integrated into a single lens unit 19. The first adjusting jig 17 is operated so that the lens unit 19 is moved along the optical axis of the semiconductor laser 11. Further, the second adjusting jig 18 is operated so that the cylindrical lens 15 is moved along the optical axis. More specifically, the first adjusting jig 17 includes a micrometer 20 and an arm 21 moved by the micrometer. The arm 21 in engagement with the micrometer 20 is moved according to an amount of operation of the micrometer so that the lens unit 19 held by the arm 21 is moved along the optical axis of the semiconductor laser 11. The second adjusting jig 18 has the same structure as the first adjusting jig 17. More specifically, the arm 21 in engagement with the cylindrical convex lens 15 is moved according to an amount of operation of the micrometer 20 so that the cylindrical convex lens 15 held by the arm 21 is moved along the optical axis of the semiconductor laser 11.

The focusing lens 16 is fixed. A location spaced from the focusing lens 16 by a work distance is set as a focusing location where the laser light is focused into the small light spot. A diffusion plate 22 is disposed at the focusing location (on the surface of the object to be marked) so that the laser light focused by the focusing lens 16 is diffused by the diffusion plate 22. An infrared camera 23 is provided in the rear of the diffusion plate 22. A microscope 24 is attached to the infrared camera 23 so that the light spot focused on the diffusion plate 22 is magnified and photographed by the infrared camera. An image photographed by the infrared camera 23 is on a monitor 25.

Figure 8:
FIG. 8 illustrates alignment for focusing on a target location the laser light produced in the direction perpendicular to the active layer of the semiconductor laser.
Figure 8:
Figure 8:
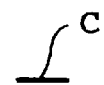
Figure 9:
FIG. 9 illustrates further alignment for the laser light.
Figure 9:
Figure 9:
Figure 9:
Figure 9:
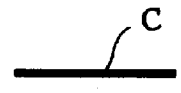

The location of the collimator lens 13 is adjusted so that the location where the perpendicular laser light is focused by the focusing lens 16 is adjusted. Further, the locations of the respective cylindrical lens 14 and 15 are adjusted so that the location where the parallel laser light is focused by the focusing lens 16 is adjusted. Accordingly, the location where the perpendicular laser light is focused is firstly adjusted and the location where the parallel laser light is focused is then adjusted, whereupon the focusing locations of the perpendicular laser light and the parallel laser light can be caused to agree to each other. More specifically, the perpendicular laser light and the parallel laser light are superposed in the image of the light spot C on the monitor 25 at first as shown in FIG. 8. In this case, a vertical width of the light spot corresponds to an amount of shift from a target location of the perpendicular laser light, whereas a horizontal width of the light spot corresponds to an amount of shift from the target location of the parallel laser light. Accordingly, the first adjusting jig 17 is operated so that the location of the lens unit 19 is adjusted so that the vertical width of the light spot as viewed in FIG. 8 becomes minimum. When the light spot is thus adjusted with respect to the vertical direction, the location of the lens unit 19 is adjusted with the magnification of the microscope 24 being increased, whereupon the light spot is further narrowed down as shown in FIG. 9.

Figure 10:
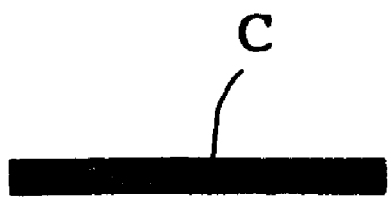
FIG. 10 illustrates alignment for focusing on a target location the laser light produced in the direction parallel to the active layer of the semiconductor laser.
Figure 10:
Figure 10:
Figure 11:
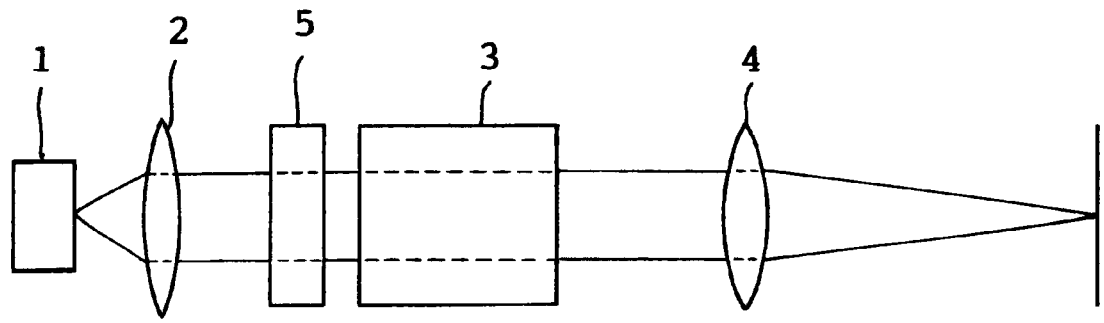
FIG. 11 is a view similar to FIG. 1, showing the optical system employed in a conventional laser marker.
Figure 12:
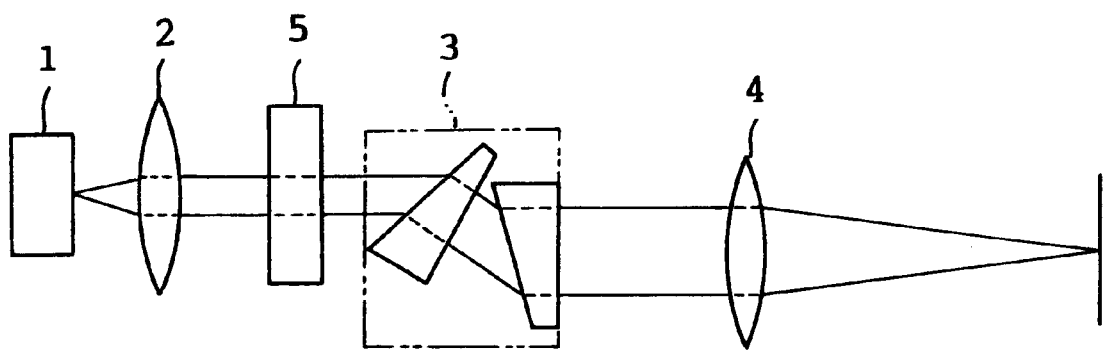
FIG. 12 is a schematic plan view of the optical system of the conventional laser marker.

The second adjusting jig 18 is then operated so that the location of the convex lens 15 is adjusted so that a horizontal width of the light spot becomes minimum as shown in FIG. 10. In this case, the focusing location of the perpendicular laser light is not changed even when the location of the cylindrical convex lens 15 is adjusted. As a result, the vertical width of the light spot can be prevented from being changed by the adjustment of the lens 15. Upon completion of locational adjustment, the lens unit 19 and the lens 15 are assembled to the body of the laser marker. Accordingly, the focusing location of the laser light produced from the semiconductor laser 11 after completion of the assembly of the laser marker is moved so that the object is marked.

According to the above-described embodiment, the optical system 12 includes the collimator lens 13, the focusing lens 16, the cylindrical concave and convex lenses 14 and 15 each serving as a lens only for the parallel laser light. The focusing locations of the perpendicular laser light and the parallel laser light by the focusing lens 16 are adjusted independent of each other. Consequently, the focusing locations of the perpendicular laser light and the parallel laser light can be caused to accurately agree to each other. In the prior art, the oblong laser light emitted from the semiconductor laser is converted by the anamorphic prism into a substantially circular shape and then focused by the focusing lens. In the foregoing embodiment, however, the laser light can be focused by a combination of small lenses, that is, the cylindrical concave and convex lenses 14 and 15. Consequently, the size of the laser marker can be prevented from being increased.

In this case, the apparent outgoing locations of the perpendicular laser light and the parallel laser light are shifted from each other by the influence of a stigmatism. However, the influence can be canceled since the locations where the perpendicular laser light and the parallel laser light are focused respectively can be adjusted independent of each other. Further, the collimator lens 13 and the cylindrical concave lens 14 are integrated together into the lens unit 19. Accordingly, the focusing location of the perpendicular laser light can be adjusted when the location of the lens unit 19 is adjusted. Since the optical axes of the concave and convex lenses 14 and 15 accurately agree with each other, a higher positioning accuracy can be achieved with respect to each lens as compared with the construction in which the locations of the respective lenses are independently adjustable. Consequently, the accuracy in the focusing location of the laser light by the focusing lens 16 can be improved.

The focusing location of the laser light is adjusted while the focusing lens 16 is fixed. Accordingly, even when the focusing lenses 16 differ in the focal distance from one product to another, the focusing locations of the perpendicular laser light and the parallel laser light can be caused to accurately agree with each other without adverse effect of the difference in the focal distance. Further, the width of the parallel laser light incident on the focusing lens 16 is larger than that of the perpendicular laser light such that the laser light incident on the focusing lens has the shape of a horizontally long ellipse. Consequently, even when the parallel laser light emitted from the semiconductor laser is of a multimode type, the light beam can accurately be focused onto a single point.

The foregoing description and drawings are merely illustrative of the principles of the present invention and are not to be interpreted in a limiting sense. Various changes and modifications will become apparent to those of ordinary skill in the art. All such changes and modifications are seen to fall within the scope of the invention as defined by the appended claims.

We claim:

1. A laser marker comprising:
   a collimator lens converting laser light emitted from a broad area semiconductor laser into substantially parallel beams of light;
   a cylindrical concave lens permitting to pass therethrough the laser light having passed through the collimator lens and being perpendicular to a plane of an active layer of the semiconductor laser, the cylindrical concave lens serving as a concave lens for the laser light having passed through the collimator lens and being parallel to the plane of the active layer;
   a cylindrical convex lens permitting to pass therethrough the laser light having passed through the concave lens and being perpendicular to the plane of the active layer of the semiconductor laser, the cylindrical convex lens serving as a convex lens for the laser light having passed through the collimator lens and being parallel to the plane of the active layer; and
   a focusing lens focusing the laser light having passed through the cylindrical convex lens.

2. The laser marker according to claim 1, wherein the collimator lens and the cylindrical concave lens are movable together.

3. The laser marker according to claim 1, wherein the focusing lens is fixed.

4. The laser marker according to claim 2, wherein the focusing lens is fixed.

5. A method of light spot adjustment for a laser marker including a collimator lens converting laser light emitted from a broad area semiconductor laser into substantially parallel beams of light, a cylindrical concave lens permitting to pass therethrough the laser light having passed through the collimator lens and being perpendicular to a plane of an active layer of the semiconductor laser, the cylindrical concave lens serving as a concave lens for the laser light having passed through the collimator lens and being parallel to the plane of the active layer, a cylindrical convex lens permitting to pass therethrough the laser light having passed through the concave lens and being perpendicular to the plane of the active layer of the semiconductor laser, the cylindrical convex lens serving as a convex lens for the laser light having passed through the collimator lens and being parallel to the plane of the active layer, and a focusing lens focusing the laser light having passed through the cylindrical convex lens, the method comprising the step of:
   adjusting locations of the respective lenses so that incidence angles of the perpendicular laser light and the parallel laser light are equal to each other when the perpendicular laser light and the parallel laser light are equidistant from an optical axis, whereupon the laser light passing through the focusing lens is focused into a small light spot.

6. The method according to claim 5, wherein the collimator lens and the cylindrical concave lens are movable together.

7. The method according to claim 5, wherein the adjustment is carried out with the focusing lens being fixed.

8. The method according to claim 6, wherein the focusing lens is fixed.

9. The method according to claim 8, wherein the locations of the collimator lens and the cylindrical concave lens and the location of the cylindrical convex lens are adjusted independent of each other so that widths of the perpendicular laser light and the parallel laser light both passing through the focusing lens are adjusted independent of each other.

10. The method according to claim 9, wherein the small light spot of the laser light passing through the focusing lens is magnified by a microscope to be photographed and the adjustment is carried out while a magnified image of the small light spot is being monitored.

* * * * *